United States Patent [19]
Peterson et al.

[11] Patent Number: 6,016,269
[45] Date of Patent: Jan. 18, 2000

[54] QUANTUM RANDOM ADDRESS MEMORY WITH MAGNETIC READOUT AND/OR NANO-MEMORY ELEMENTS

[75] Inventors: William M. Peterson, Chandler; Eugene Y. Chen, Gilbert, both of Ariz.

[73] Assignee: Motorola, Inc., Schaumburg, Ill.

[21] Appl. No.: 09/163,880

[22] Filed: Sep. 30, 1998

[51] Int. Cl.[7] .................................................. G11C 11/14
[52] U.S. Cl. ........................ 365/171; 365/151; 365/157
[58] Field of Search ..................................... 365/171, 151, 365/153, 157, 158, 148, 162

[56] References Cited

U.S. PATENT DOCUMENTS 5,322,344  6/1994  Katayama et al. ...................... 365/162

*Primary Examiner*—V A Le
*Assistant Examiner*—David Lam
*Attorney, Agent, or Firm*—Eugene A. Parsons; William E. Koch

[57] ABSTRACT

Quantum random address memory apparatus including a low dimensional plurality of address ports, a plurality of magnetic nano-memory elements, mixer elements coupling the address ports to a high dimensional plurality of the plurality of magnetic nano-memory elements, and data output ports and structure coupled to the plurality of magnetic nano-memory elements. The high dimensional plurality of magnetic nano-memory elements is greater than the low dimensional plurality of address ports by a number resulting in substantially error free memory recalls.

17 Claims, 7 Drawing Sheets

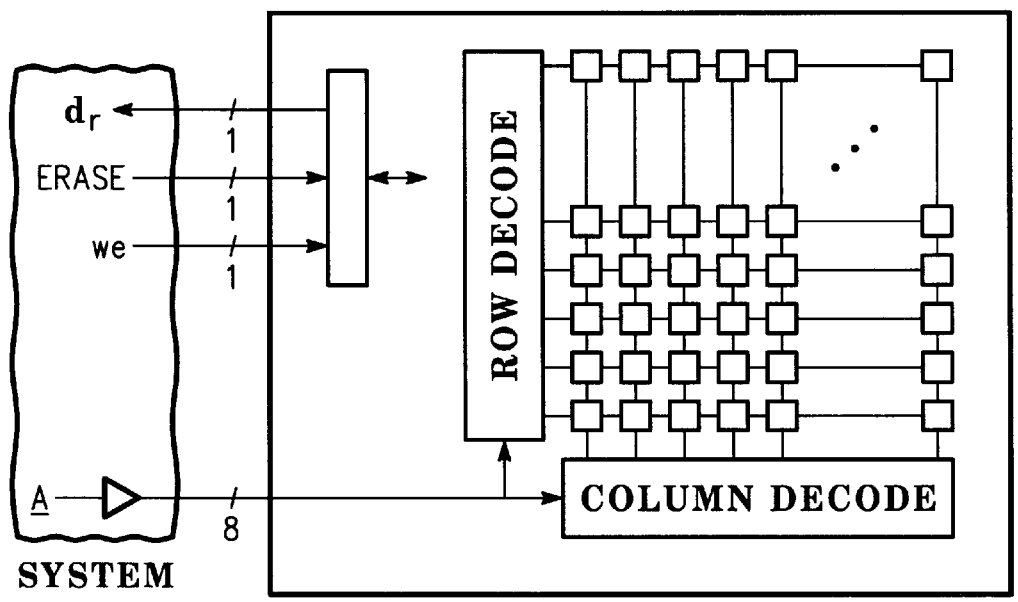
- *PRIOR ART* - FIG. 1
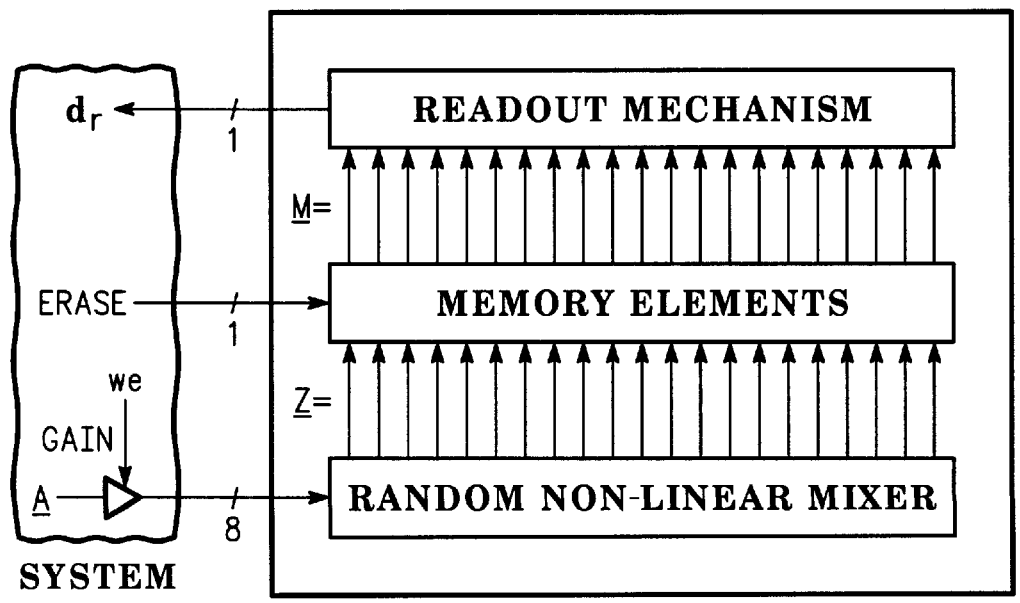
FIG. 2

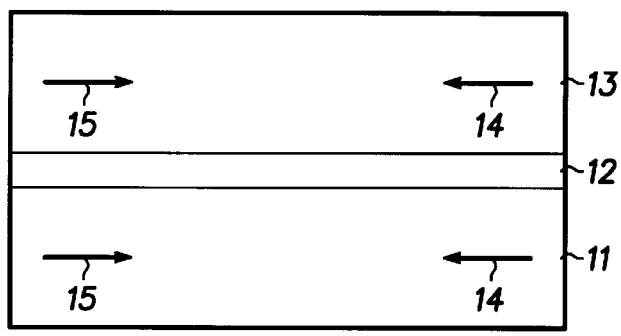
FIG. 3
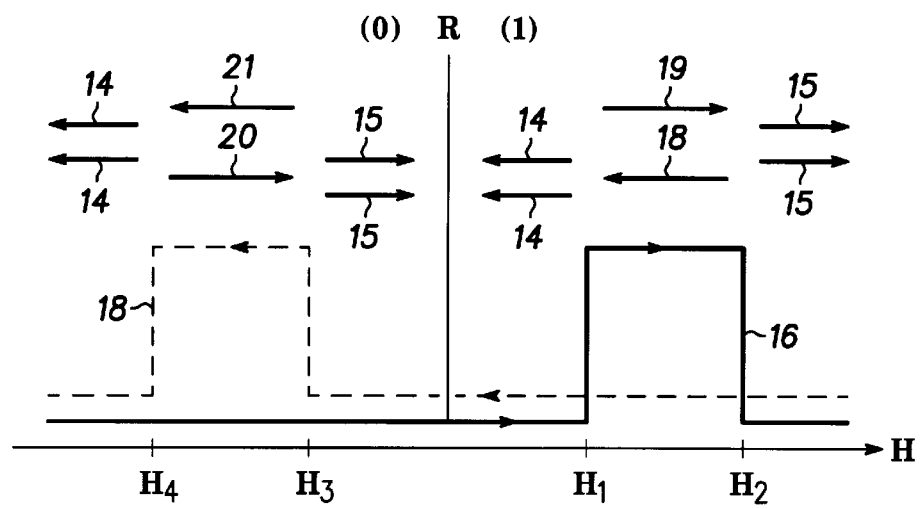
FIG. 4
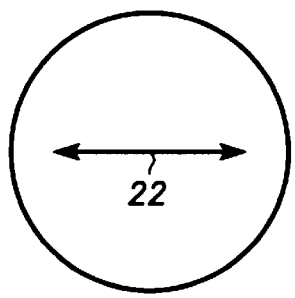 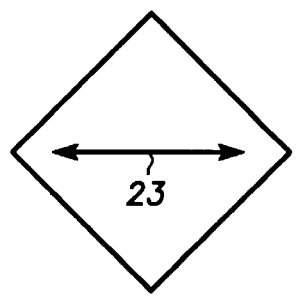 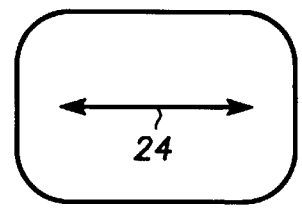
FIG. 5   FIG. 6   FIG. 7

QUANTUM RANDOM ADDRESS MEMORY WITH MAGNETIC READOUT AND/OR NANO-MEMORY ELEMENTS

FIELD OF THE INVENTION

The present invention pertains to memory apparatus and more specifically to a novel memory and addressing scheme using magneto-resistive materials in a mixer and/or in nano-memory elements.

BACKGROUND OF THE INVENTION

At the present time memories are utilized in virtually every type of electrical and electronic device to store data, e.g. information, operating instructions, etc. These memories are manufactured in a large variety of types including random access memories (RAM), read only memories (ROM), erasable/programmable memories (EPROM), electronically erasable/programmable memories (EEPROM), to name a few. Also, these various memories are manufactured using a variety of techniques and physical concepts, e.g. magnetic memories, capacitive memories, etc., which are in turn divided into active arrays and passive arrays. Further, at least some of the memories are small enough to allow up to mega-bytes of information to be stored in a single memory module of practical size.

However, one major problem that is prevalent in all of the prior art memories is the fact that each bit of memory must be addressed individually by means of critically positioned conductors to read (and/or write) information from (or to) the bit. Most conventional memories are intrinsically two dimensional. The usual addressing technique for 2-D memories requires the selection of a row and column port of the array which are common to the selected bit. These rows and columns provide access to localized memory elements that are uniformly distributed in one plane. This results in hundreds of critically positioned conductors (rows, columns and I/O terminals or ports) in conjunction with the large arrays of memory bits making up a large memory. In many instances the I/O ports actually require more chip real estate or area than the array of memory bits. Because present day manufacturing techniques are limited to some type of lithography in the fabrication of the memory arrays and because the line size of the lithography is limited to submicron (generally 0.25 mm), the size of present day memories is quickly reaching an upper limit. This is primarily due to escalating fabrications costs as well as undesired quantum effects. (For example, Professor W. Maly at Carnegie Mellon showed that extrapolations of cost projections in the SIA's 1997 National Technology Roadmap for Semiconductors result in single-die costs as high as $1800 for DRAMS.) Further, as lithography line sizes are reduced and memories are made larger, the cost of manufacturing the memories is increasing at a very substantial rate.

Yet, the motivation for continued miniaturization is such that all major corporations are conducting research to find nanometer-sized implementations for the logic and memory functions. In the published research literature on such nanometer-sized functions, three major problems remain: unacceptably high error rates at room temperatures; lack of cost effective mass production; and no effective I/O interface with ordinary CMOS logic.

Recently, a great deal of work and research has been done on magnetic memories, including magneto-resistive memory cells and magnetic tunnel junctions. See for example, U.S. Pat. No. 5,734,605, issued Mar. 31, 1998, entitled "Multi-Layer Magnetic Tunneling Junction Memory Cells", which is incorporated into this disclosure by reference. At the present time these cells are still relatively complicated to fabricate and connect into arrays of memory cells.

Thus, it would be very beneficial to provide a magnetic readout and/or a magnetic memory which does not require (expensive) precision fine detail lithography in order to isolate and access each individual bit in the memory for read and/or write operations.

It is a purpose of the present invention to provide a new and improved magnetic memory and logic.

It is another purpose of the present invention to provide a new and improved magnetic memory that is relatively simple and inexpensive to manufacture.

It is still another purpose of the present invention to provide a new and improved magnetic memory with pseudo-randomly positioned nano-memory elements.

It is yet another purpose of the present invention to provide a new and improved magnetic memory that is highly manufacturable and does not require fine detail lithography to produce the nano-memory elements.

It is a further purpose of the present invention to provide a new and improved magnetic memory that is much smaller than prior art memories.

SUMMARY OF THE INVENTION

The above problems and others are substantially solved and the above purposes and others are realized in quantum random address memory apparatus including a low dimensional plurality of address ports, a plurality of magnetic nano-memory elements, mixer elements coupling the address ports to a high dimensional plurality of the plurality of magnetic nano-memory elements, and data output ports and structure coupled to the plurality of magnetic nano-memory elements. The high dimensional plurality of magnetic nano-memory elements is greater than the low dimensional plurality of address ports by a number resulting in substantially error free memory recalls.

In specific embodiments, the plurality of magnetic nano-memory elements include either a plurality of spherical, cylindrical, irregular or somewhat 'flattened' versions of spheres or cylinders, magnetic tunnel junctions or a plurality of layered magnetic tunnel junctions. Further, the data output ports and structure can include a magnetic readout with layers of either magnetic tunnel junctions or magneto-resistive material.

BRIEF DESCRIPTION OF THE DRAWINGS

Referring to the drawings:

FIG. 1 is a simplified block diagram of a prior art flash memory;

FIG. 2 is a simplified block diagram illustrating various components and their operation in a memory in accordance with the present invention;

FIG. 3 is a simplified side view of a multi-layer magnetic memory cell illustrated for purposes of explaining the operation;

FIG. 4 is a graph illustrating characteristics of the cell of FIG. 3;

FIGS. 5–7 are plan views of different potential embodiments for magnetic cells having low aspect ratios;

DESCRIPTION OF THE PREFERRED EMBODIMENTS

Figure 8:
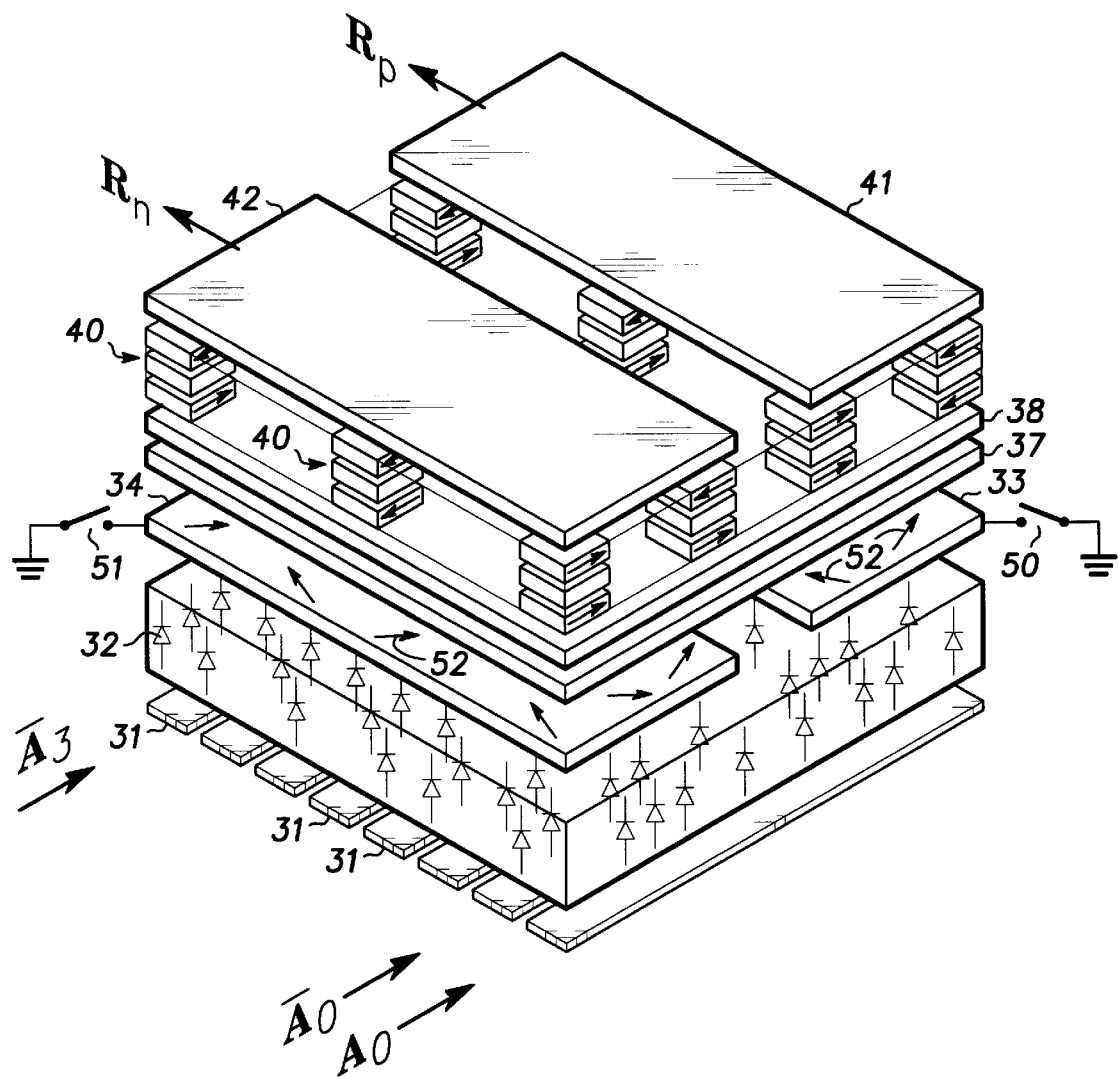
FIG. 8 is a simplified isometric, partial schematic, view of an embodiment of quantum random address memory apparatus in accordance with the present invention.

Turning now to the drawings and specifically to FIG. 1, a prior art 256×1 flash memory is illustrated in simplified block form. The operation of the flash memory will be understood by those skilled in the art and, therefore, will not be explained in detail herein. The conventional flash memory uses spatially independent bit cells by splitting the 256 addresses into 16 rows and 16 columns, as shown in FIG. 1. One cell, capable of storing one bit, is positioned at each row-column intersection so that each cell has a unique row-column intersection at which it can be addressed without effecting any of the other cells. It should be noted however, that the prior art flash memory is a two dimensional device only and utilizing any of the well known present practices requires the use of lithography for the fabrication of every bit. Further, the best that can be produced at the present time results in a chip area size of approximately 2000 square microns for 256 bits.

Turning now to FIG. 2, a simplified block diagram/flow chart is provided illustrating various components and their operation in 256×1 quantum random address memory apparatus in accordance with the present invention. The simplified block diagram/flow chart of FIG. 2 is provided only for use in describing the operation and theory of the apparatus and is not intended to describe a complete working structure. The 256 bit apparatus of FIG. 2 includes eight address ports, $A_0$ through $A_7$, that are illustrated as A and are coupled through eight buffer amplifiers to pseudo-random nonlinear mixer elements. Because of the number of mixer elements and the connections to the eight address ports, as illustrated in FIG. 2, eight address bits into the system results in 10,000 bits (channels, lines or bits) out. The mixer elements are coupled to memory elements which are in turn coupled to readout mechanism. While more memory elements may be included, it is assumed that at least 10,000 memory elements are coupled to 10,000 mixer elements. Here it should be noted that 10,000 memory elements are utilized because that number yields a substantial noise margin, as will be explained presently, as well as a small area of about 4 square microns for a 256×1 bit memory. Thus, the apparatus has a total area approximately 500 times smaller than the area of the prior art flash memory illustrated in FIG. 1.

To understand the operating principle of the quantum random address memory apparatus, it should be understood that statistically independent bit cells (statcells) are used. First, vector M, which comprises magnetized regions on 10,000 nano-memory elements, such as ferromagnetic islands is unmagnetized or randomly re-magnetized. This clears all 256 statcells to the logical '0' state. Now only the statcells that are selected to be logical '1's need to be written. All 256 bits are stored, in a distributed fashion, in the memory vector M. Each nano-memory element in M stores only a small fraction of each of the 256 bits. That is, each whole bit is distributed among all of the 10,000 nano-memory elements of M. This distributed code provides excellent noise and fault tolerance For each address A, there is a different random vector $Z_A$ of dimension 10,000. The 10,000 nano-memory elements in each $Z_A$ vector are each +1 or −1. (Note, other functionally equivalent systems can be used, too. For example, '1' and '0' with positive summation and negative summation nodes.) The independence of the 256 statcells is achieved based upon simple probabilities. For example, writing a '1' bit into the statcell corresponding to address A=35 (statcell$_{35}$) does not change the data bit in the statcell corresponding to address A=36 because it is almost certain that $Z_{35}$ has nearly zero correlation with $Z_{36}$.

To read out the data bit stored in statcell$_{35}$, simply measure the degree of similarity between the two patterns M and $Z_{35}$. One way to do this is to threshold the scalar product of $Z_{35}$ and M. For example, if $Z_{35}$ is added to M, then this new M' will be more similar to $Z_{35}$ (i.e. data bit=1) than if the addition had not been done (i.e. data bit=0). Note that the vector or pattern $Z_{35}$ is used as a reference, somewhat like a reference beam in holography or a channel code in CDMA telephony.

To write a '1' data bit to statcell$_{35}$, simply add $Z_{35}$ to M. Likewise, to write a '1' data bit to statcell$_{36}$, simply add $Z_{36}$ to M. Note that $Z_{35}$ and $Z_{36}$ are added to the same M. The nearly zero correlation keeps the data bits in statcell$_{35}$ and statcell$_{36}$ separate and independent.

In essence, statcell independence occurs because adding $Z_{35}$ to M adds +1 to a specific subset$_1$, of the elements in M and subtracts 1 from the remaining specific subset$_2$ of the elements in M. Now, adding $Z_{36}$ to the same M adds as much as it subtracts from the subset$_1$ Likewise, for subset$_2$. The net effect is zero. When the data bit in statcell$_{35}$ is read back or recalled (i.e. M is probed with $Z_{35}$), the pattern similarity measure is essentially unchanged. Thus, writing to statcell$_{36}$ does not disturb the data in statcell$_{35}$. Note that this independence can result from random or pseudo-random vectors of high dimension (10,000 in this example) for excellent error tolerance.

Turning now to FIG. 3, an enlarged, simplified side view is illustrated of a magnetic memory cell 10 having multiple layers that are ferromagnetically coupled. Cell 10 is illustrated for purposes of briefly explaining the operation of magnetic tunnel junctions. Cell 10 includes a first magnetic layer 11 and a second magnetic layer 13, which are separated by a first insulating spacer layer 12. Magnetic layers 11 and 13 each can be single layers of ferromagnetic materials such as a layer of nickel, iron, cobalt, or alloys thereof including alloys having palladium or platinum therein. Alternatively, either of layers 11 and 13 can be a composite ferromagnetic layer, such as a layer of nickel-iron-cobalt covering a layer of cobalt-iron or three layer structures including layers of cobalt-iron and nickel-iron-cobalt and cobalt-iron with cobalt-iron at the interface with adjacent layers. Materials that are suitable for layer 12 include most non-conductive materials such as oxides, nitrides, dielectrics, etc.

For purposes of this explanation, layers 11 and 13 are rectangular and are formed with the easy axis of magnetization along the length and not along the width. Layers 11 and 13 each have magnetization vectors 14 and 15 that are positioned substantially along the length and in the plane of the layers 11 and 13, respectively. Additionally, the width is formed to be smaller than the width of the magnetic domain walls or transition width within layers 11 and 13. Consequently, vectors 14 can not be parallel to the width. Typically, widths of less than 1.0 to 1.2 microns result in such a constraint. In typical magnetic memories presently utilizing cells similar to cell 10, the width is less than one micron and is as small as can be made by manufacturing technology, and the length is greater than the width, generally five times or greater. Also, the thicknesses of layer 11 and 13 are approximately three to ten nanometers and may be different in some embodiments. The difference in the thicknesses affects the switching points of layers 11 and 13 and is utilized in some structures for reading and writing cells.

As illustrated in FIG. 3, vectors 14 and 15 in layers 11 and 13 represent two different states of magnetization within cell 10. It should be understood that these are the same vectors and that they are given different numbers only to indicate different states. One state is referred to as a logic "0" and the other state is a logic "1". While it will be understood by those skilled in the art that any logic definition can be assigned to either state, in this example when vectors 14 of layers 11 and 13 both point to the left in FIG. 1, cell 10 is in a logic "0" state and when vectors 15 in both layers 11 and 13 are in the opposite direction cell 10 is in a logic "1" state. Thus, for a first state magnetization vectors in both layers 11 and 13 point in a first direction and for a second state magnetization vectors in both layers 11 and 13 point in an opposite direction. Also, because layers 11 and 13 are ferromagnetically coupled the magnetic vectors of layers 11 and 13 are always pointing in the same direction (parallel) when no (or a very small) magnetic field is applied to cell 10. The magnetic vectors are only pointing in opposite directions (antiparallel) when specific magnetic fields are applied to cell 10, as will be explained in more detail presently.

It should be understood by those skilled in the art that the structure of the present invention can be operated with modes other than the preferred ferromagnetic modes. Two examples are the antiferromagnetic mode and the spin valve mode. In the antiferromagnetic mode, the resting states of the two magnetic layers 11 and 13 are either clock-wise or counter-clock-wise antiparallel orientations of vectors 14 and 15. These two states can be used as logic "0" and logic "1" states. In the spin valve mode, one of the layers 11 and 13 is pinned and the other layer can be switched to be either parallel or antiparallel to the pinned layer. The parallel and antiparallel states of vectors 14 and 15 can be used as logic "0" and logic "1" states. It should be noted that more than two states can be obtained by partial magnetization or by statistical combinations of several two-state-elements.

In this specific example, cell 10 is designed with layer 13 thinner than layer 11 so that a smaller magnetic field will switch the magnetization vectors of layer 13 than is required to switch the magnetization vectors of layer 11. Another way to accomplish this design is to form layer 11 out of magnetic material that requires a higher magnetic field to switch the magnetization vectors.

The provision of insulating layer 12 between ferromagnetic layers 11 and 13 produces a tunneling junction which allows a flow of current perpendicularly through layer 12, from layer 11 to layer 13 (or vice versa). Essentially, cell 10 appears as a relatively high impedance (referred to herein as a resistance R), generally several thousand ohms, e.g. 5 to 6 kohms. When the magnetization vectors in layers 11 and 13 are antiparallel the resistance R of cell 10 remains very high. When the magnetization vectors in layers 11 and 13 are parallel, the resistance R of cell 10 drops perceptibly.

In a specific example, layer 11 is formed of cobalt (Co) approximately 100 Å thick (generally in a range of 10 Å to 200 Å), layer 12 is formed of aluminum oxide ($Al_2O_3$) approximately 25 Å thick (generally in a range of 10 Å to 100 Å), and layer 13 is formed of nickel iron (NiFe) approximately 100 Å thick (generally in a range of 10 Å to 200 Å). The change of resistance versus the resistance ($\Delta R/R$) is approximately 15% in the present specific example and is generally in a range of 10% to 50%. Thus, the state of cell 10 is relatively easily sensed by passing a sense current therethrough from layer 11 to layer 13 (or vice versa). The change of resistance in cell 10 is easily read as a change in voltage drop across cell 10 which can conveniently be used in conjunction with memory arrays and the like.

Referring specifically to FIG. 4, a graph is illustrated showing the resistance of cell 10 with an aspect ratio greater than five versus different directions of orientation for the magnetic vectors in layers 11 and 13. Also, the direction and strength of an applied magnetic field, required to achieve the various vector directions is shown. The abscissa of the graph indicates magnetic field direction and strength and the ordinate represents the resistance of cell 10. Further, a first curve 16 indicates the cell resistance which can be achieved for the application of various strengths of a magnetic field in a first direction and a curve 17 indicates the cell resistance which can be achieved for the application of various strengths of a magnetic field in a second direction. Vectors 18 and 19 are illustrated with curve 16 and represent the magnetic vectors in layers 11 and 13, respectively, for the application of a magnetic field between values $H_1$ and $H_2$ in the positive direction along the abscissa. Similarly, vectors 20 and 21 are illustrated with curve 17 and represent the magnetic vectors in layers 11 and 13, respectively, for the application of a magnetic field between values $H_3$ and $H_4$ in the negative direction along the abscissa.

Assuming cell 10 is in the state in which vectors 14 both point to the left, moving to the right along the abscissa, the magnetic field increases up to a value $H_1$. Before the value $H_1$ is reached, magnetic vectors 14 are oriented in the same direction, designated a logic "1", and the resistance of cell 10 is low. Upon applying sufficient magnetic field to cell 10, herein designated by the value $H_1$, vector 19 switches to an opposite direction (as shown) and the resistance of cell 10 increases perceptibly. As the magnetic field is increased beyond a value $H_2$ vector 18 also switches to an opposite direction and the resistance of cell 10 again drops to a low value with the magnetic vectors now being represented by vectors 15. Similarly, if the magnetic field is applied in the opposite direction curve 17 applies and magnetic vector 21 of layer 13 switches at a value $H_3$ and the magnetic vector 20 of layer 11 switches at a value $H_4$, with the magnetic vectors now being represented by vectors 14. It should be noted that once the vectors of layers 11 and 13 are set in the orientation depicted by vectors 14 or 15 they will remain in that orientation, even after the applied magnetic field is removed, until a magnetic field sufficiently strong to switch them is applied.

An additional feature of the magnetic cells disclosed herein is that in cells having a length/width ratio of greater than approximately 5 the first and second layers of magnetic material are ferromagnetically coupled while in cells having a length/width ratio of less than approximately 5 the first and second layers of magnetic material are antiferromagnetically coupled. Generally, for purposes of this disclosure the term "ferromagnetically coupled" means that either of the parallel states (magnetic vectors 14 or 15, in FIG. 3) is stable and does not require a constant magnetic field. Also, for purposes of this disclosure the term "antiferromagnetically coupled" means that either of the antiparallel states is stable and that the parallel state is unstable and does require a constant magnetic field, since the magnetic vectors always tend to move to an antiparallel state.

Referring to FIGS. 5–7, plan views of different potential embodiments in accordance with the present invention for magnetic cells having low aspect ratios are illustrated. When the aspect ratio of a single magnetic layer is close to one, such as for circular, square or diamond shaped, or elliptical, its switching field from shape anisotropy is minimum. In the case of circularly shaped cells, as illustrated in FIG. 5, the preferred magnetization direction, represented by a magnetic vector 22 is determined by uniaxial crystal field anisotropy (or magnetic crystalline anisotropy). This preferred magnetization direction is set during film deposition by a bias field or by annealing the film after deposition in a high magnetic field (e.g. several kOe) at elevated temperatures (e.g. 200° C. to 300° C.). In the case of a square or diamond shape, as illustrated in FIG. 6, the uniaxial crystal anisotropy, represented by magnetic vector 23 for its easy axis, is set along a diagonal direction of the square. In the case of an elliptically shaped cell, illustrated in FIG. 7, the uniaxial crystal anisotropy, represented by magnetic vector 24 for its easy axis, is set along the long axis of the cell. The main idea here is to minimize the shape effect, which contributes to the rise in required switching fields at narrow cell widths, and to utilize magnetic crystalline anisotropy to set the preferred magnetization direction needed by a memory cell. While circular, square and elliptical cells are illustrated for example, it should be understood that the above description applies as well to other shapes, such as spherical, etc.

Turning to FIG. 8, a simplified isometric, partial schematic, view is illustrated of an embodiment of quantum random address memory apparatus 30 in accordance with the present invention. Apparatus 30 includes eight address ports, designated $A_0$ through $A_3$, and the invert of each. In this embodiment the address ports are represented by eight parallel spaced apart conductive strips 31, one strip for each of the address ports. A plurality of mixer elements, which in this embodiment are randomly placed nano-diodes 32, each has one terminal (in this embodiment the anode) coupled to the address ports 31 Explicit details on the fabrication of randomly placed nano-diodes can be found in a copending U.S. patent Application entitled "Quantum Random Address Memory with Randomly Positioned Nano-diode Mixer", filed of even date herewith, bearing attorney docket number CR98-090, and assigned to the same assignee.

A pair of spaced apart electrical conductors 33 and 34 are positioned over nano-diodes 32 so as to extend transverse to the parallel spaced apart strips 31 with each electrical conductor 33 and 34 coupled (to the cathodes) to a different approximately one half of the plurality of nano-diodes 32. An electrical insulating layer 37 is positioned over conductors 33 and 34 and an electrically conducting layer 38 is positioned over insulating layer 37. A plurality of magnetic nano-memory elements, which in this embodiment are randomly placed magnetic tunneling nano-junctions 40, are positioned on layer 38. A pair of spaced apart electrical conductors 41 and 42 are positioned over magnetic tunneling nano-junctions 40 so as to extend transverse to the parallel spaced apart strips 31 (generally overlying conductors 33 and 34) with each electrical conductor 41 and 42 coupled to a different approximately one half of the plurality of nano-junctions 40. Conductors 41 and 42 are connected to provide signals $R_p$ and $R_n$, respectively, which when combined ($R_p - R_n$) produce a data bit output. Generally, conductors 33 and 41 define a 'p' section of apparatus 30 and conductors 34 and 42 define a 'n' section. It should be noted that none of the structure illustrated in FIG. 8 requires lithography, except possibly strips 31 and electrical conductors 33, 34 and 41, 42.

Each magnetic tunneling nano-junction 40 includes a pair of magnetic layers (preferably one soft and one hard magnetic material layer) separated by a very thin non-magnetic non-conducting (electrically) layer which serves as a barrier. The aspect ratio of magnetic tunneling junctions 40 will generally be less than 5 so that the magnetic layers are antiferromagnetically coupled. However virtually any aspect ratio can be provided and virtually any of the shapes described in conjunction with FIGS. 5–7 can be utilized. Generally, in the fabrication a blanket first magnetic layer, a blanket insulating barrier layer, and a blanket second magnetic layer are deposited on a supporting surface (e.g. layer 38). Nano-memory elements (nano-junctions 40) are defined by some type of patterning and etching technique, e.g. the use of resist material to overlie and define each nano-memory element. The resist material is then used as an etch mask to etch through the first and second magnetic layers and the insulating layer around each nano-memory element. After the etching is complete, the array of nano-memory elements can be planarized with an insulating (non-electrical and non-magnetic) material and layers 41 and 42 are patterned on the planarized surface.

The patterning of the nano-memory elements does not require fine lithography since placement is not crucial and any convenient technique can be used to produce the pseudo-random positioning. Here it should be understood that the highly accurately positioned memory elements of conventional memories are one extreme of the spectrum while totally random memory elements are the other extreme. There is a lot of middle ground between these extremes which can be achieved by biasing the statistics in favor of even more uncorrelated Z vectors. This middle ground is encompassed in the present disclosure in the term "pseudo-random" which is intended to cover everything from totally random to somewhat randomly positioned, as long as the placement does not require fine detail lithography and critical alignment. The pseudo-random fabrication and placement of quantum dots is a relatively straight forward process involving the deposition or etching of material and not requiring any lithography or the like.

Each magnetic tunneling nano-junction 40 is sandwiched between layer 38 and either conductor 41 or 42 so that one magnetic layer is positioned on layer 38 and the other magnetic layer is positioned on one of conductors 41 or 42. With an appropriate voltage applied carriers will tunnel from one of the magnetic layers to the other magnetic layer through the barrier layer. Each magnetic tunneling nano-junction 40 appears electrically as a resistance with the amount of resistance being determined by the direction of magnetic vectors in each of the two magnetic layers. If the magnetic vectors in a nano-junction are pointed in the same direction (parallel) the resistance is a minimum and if the vectors are pointed in opposite directions (antiparallel) the resistance is a maximum. Thus, by setting the magnetic vectors in each nano-junction 40, a '1' or a '0' (represented by a low or a high resistance) can be stored.

In the operation of apparatus 30, conductor 33 can be grounded through a switch 50 to write a '1' into the 'p' section and conductor 34 can be grounded through a switch 51 to write a '0' into the 'n' section. When switch 50 is closed, for example, conductor 33 is grounded, Each nano-diode 32 connected to conductor 33 produces a current in conductor 33 (represented by arrows 52) in accordance with the signals applied to strips 31, which creates a field that modifies the magnetic vector in the closest magnetic tunneling nano-junction 40. To read the stored information, a signal is applied to conductive layer 38 and read at conductors 41 and 42 as $R_p$–$R_n$. This read operation occurs while applying a relatively low current address to address conductors 31 such that no permanent magnetization is caused, yet a temporary magnetization of the soft magnetic layer in 40 occurs. Again it must be understood that the nano-diodes 32 and the number of magnetic tunneling nano-junctions 40 are great enough to insure that a write signal applied to each strip 31 effects a substantially different group of pairs of nano-diodes 32 and magnetic tunneling nano-junctions 40.

Figure 9:
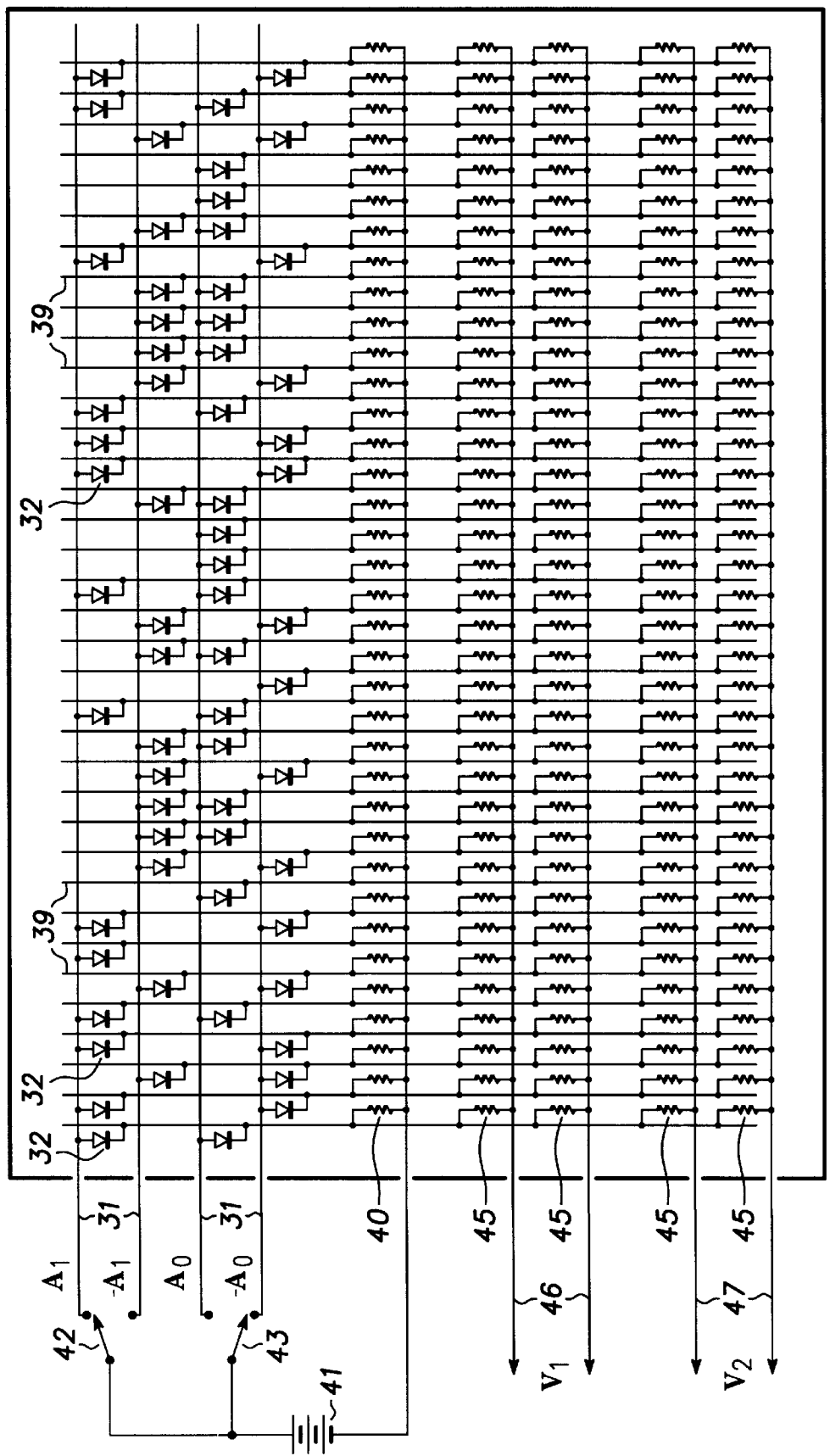
FIG. 9 is a greatly simplified schematic view representative of the quantum random address memory apparatus illustrated in FIG. 6.

Turning now to FIG. 9, a greatly simplified schematic view is illustrated of the quantum random address memory apparatus 30 illustrated in FIG. 8. The schematic diagram of FIG. 9 is intended to aid in the understanding of apparatus 30 of FIG. 8 and is not intended as a rigorous representation of that apparatus. For simplicity, only four conductive strips 31, designated individually as $A_0$, –$A_0$, $A_1$, and –$A_1$, for convenience, are illustrated for address ports. (It should be understood that the minus sign, e.g. –$A_0$, indicates a negative, reciprocal, or compliment of the mating signal, i.e. $A_0$) Also, a plurality of nano-diodes 32, representing mixer elements, each have the anode connected to one of the strips 31 for simplicity in explaining the addressing, as will be understood presently. Further to accentuate the different connections of the mixer elements different nano-diodes are connected to each strip 31. The mixer, including nano-diodes 32, has outputs (for example, the 10,000 terminals described in conjunction with FIG. 2) represented in FIG. 9 by a plurality of mixer leads 39. Each mixer lead 39 is connected through an associated resistor 40 to the negative side of a power supply 41. The positive side of power supply 41 is connected to the arms of a pair of two position switches 42 and 43, which represent the application of an address (1 or 0) to strips 31. A plurality of nano-memory elements 45 are illustrated schematically as resistors each having one end connected to one of the plurality of mixer leads 39. In this simplified schematic view a first data output port $V_1$ is represented by a pair of output leads 46 and a second data output port $V_2$ is represented by a pair of output leads 47. The opposite end of each of the nano-memory elements (resistors 45) is connected to one of the pair of output leads 46 or one of the pair of output leads 47.

In this embodiment, to simply illustrate the operation, the pair of switches 42 and 43 are connected to complete a circuit between a selected pair of strips 31 and power supply 41. Switch 42 applies a positive voltage to $A_1$ in a first position and to –$A_1$ in a second position. Switch 43 applies a positive voltage to $A_0$ in a first position and to –$A_0$ in a second position. In each instance the positive voltage is applied to the anode of a different set of nano-diodes 32 and represents a 1 or a 0. The negative side of power supply 41 is connected to each mixer lead 39 through associated resistor 40 to complete the circuit for purposes of this representation (although one skilled in the art can easily substitute alternate current return paths).

Figure 10:
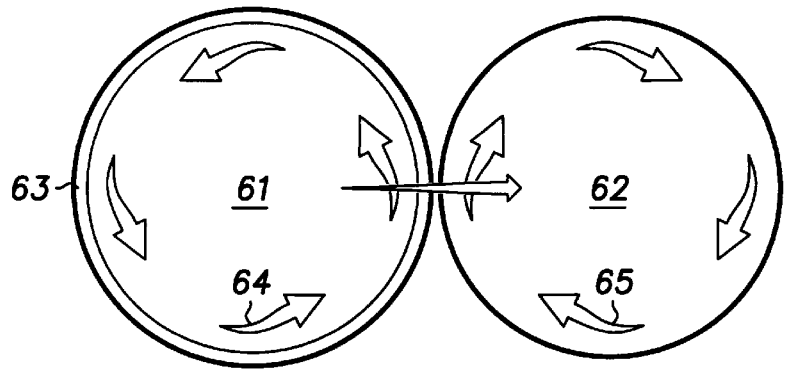
FIG. 10 is a greatly enlarged view of a spherical magnetic tunnel junction in accordance with the present invention.

Turning now to FIG. 10, a greatly enlarged view is illustrated of a spherical magnetic tunnel junction 60 in accordance with the present invention. Spherical magnetic tunnel junction 60 includes a sphere 61 of soft magnetic material and a sphere 62 of permanently magnetized hard ferro-magnetic material. One or both of the spheres 61 or 62 is coated with a layer 63 of tunnel barrier material so that spheres 61 and 62, with tunnel barrier layer 63 sandwiched therebetween forms a magnetic tunnel junction. In this specific example, spheres 61 and 62 have a diameter of approximately 50 nanometers, although different sizes could be utilized. Sphere 61 has magnetic vectors 64, represented as arrows, directed toward its magneto-crystalline easy axis direction. However, since sphere 61 is formed of soft magnetizable material, the direction of magnetic vectors 64 can be reversed by simply applying a magnetic field to sphere 61 in a reverse direction. Sphere 62 has magnetic vectors 65, represented as arrows, directed toward its preset direction. Since sphere 62 is formed of 'permanently' magnetized material, the direction of magnetic vectors 65 remain in the fixed direction, even when a magnetic field is applied to sphere 61 during a memory read operation. During a write operation, the magnetization of some spheres 62 will change since write address currents are relatively high. Just which spheres 62 will change their magnetization depends upon the specific address A, the three dimensional positions of all address conductors (in the proximity of proximity of each sphere 62) and whether or not a logic '1' is to be written. Here, if an address is never written to, its contents is, by definition, a logic '0' (since the whole memory is cleared before beginning).

Assuming the magnetic vectors 64 and 65 of spheres 61 and 62, respectively, are in the directions illustrated in FIG. 10 (parallel), with spheres 61 and 62 in abutting engagement so that tunnel barrier layer 63 is sandwiched therebetween, the resistance to current tunneling from sphere 61 to sphere 62 (or vice versa) is at a minimum. Further, if the magnetic vectors 64 of sphere 61 are in the opposite direction (antiparallel), the resistance to current tunneling from sphere 61 to sphere 62 is at a maximum.

Figure 11:
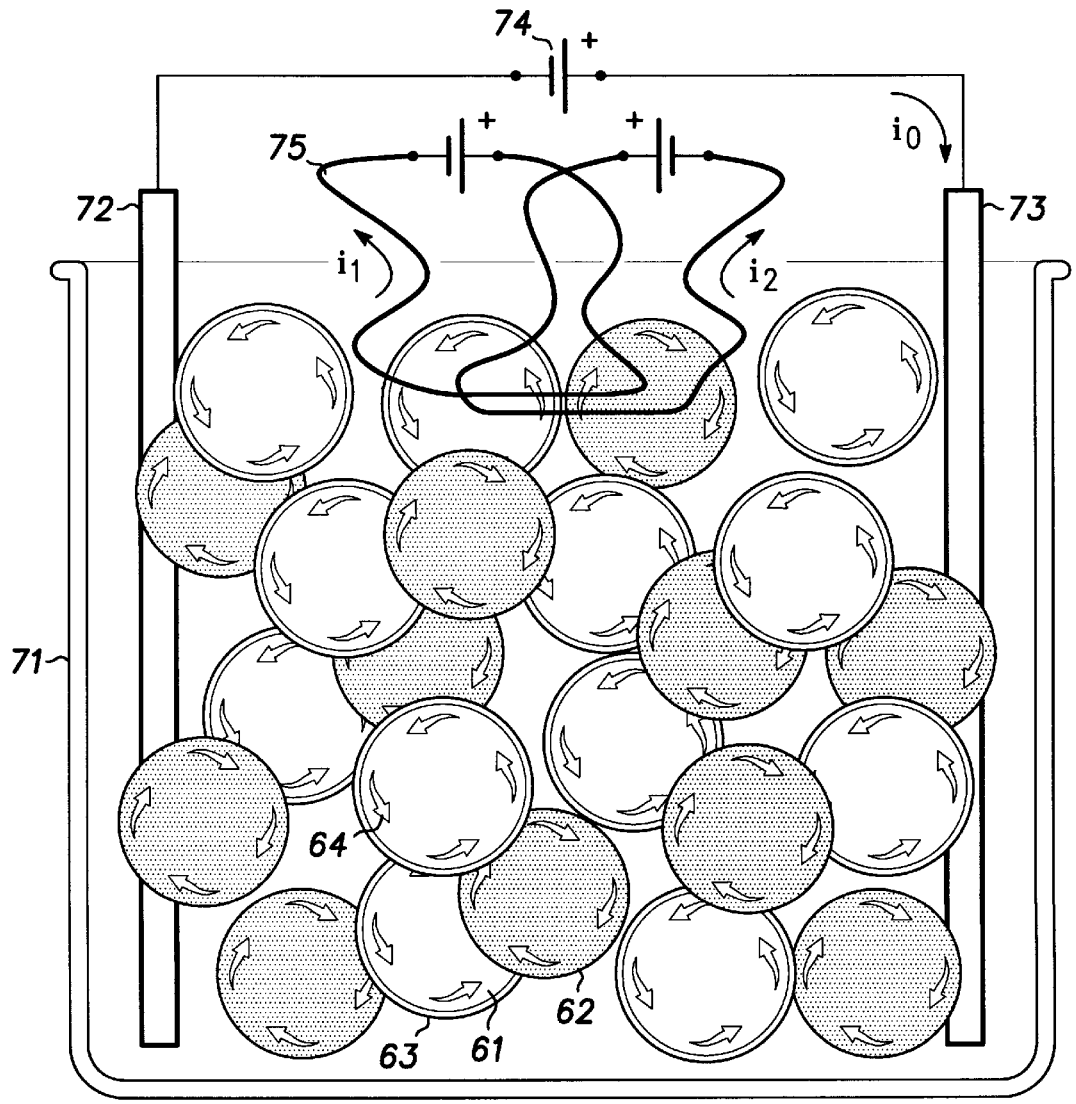
FIG. 11 is an enlarged view of a plurality of magnetic nano-memory elements, similar to that illustrated in FIG. 10, assembled in a memory.

Referring specifically to FIG. 11, an enlarged view is illustrated of a plurality of spherical magnetic nano-memory elements 60, similar to that illustrated in FIG. 10, assembled in a memory 70. Memory 70 includes a plurality of nano-memory elements 60 fixed in a container 71 (for purposes of this explanation only). Also included in container 71 is a pair of electrodes 72 and 73 having a power source 74 attached therebetween. A plurality of insulation coated electrically conducting loops (e.g. nanowires or conducting molecules) pseudo-randomly snake throughout the volume of container 71). An address signal (e.g. A0, –A0, A1, –A1, A2, . . . or –A7) can drive current $i_1$ and $i_2$ in each loop. In addition, these currents $i_1$ and $i_2$ can be relatively limited for read operations.

To begin operation, the whole memory is erased: The magnetic spheres in 70 are unmagnetized or re-magnetized in weak random orientations. This can be done by an external coil driven by decaying alternating current. At this point all memory locations contain a logical '0'.

Next, the user writes only those memory locations that he wishes to contain logical '1's. his is done by applying address A to the eight electrically conducting loops (each of which is pseudo-randomly routed throughout the 3-D volume in container 71). Note that at any point in the volume there is a nearby pair of spheres (e.g. 61 and 62)and a somewhat unique combination of address bit conductors (e.g. A2 and –A5 and A6) will be in close proximity. That is, the net local magnetic field will depend upon A. A nonlinearity, such as an abrupt magnetization curve for the hard magnetic material spheres (or other field perturbing elements), provides sufficient address mixing action to yield effective linearly independent Z vectors throughout the volume of memory 70.

Reading a memory location uses a procedure similar to that used for writing, except lower currents are applied to the plurality of current loops (like 75) in order to avoid any permanent magnetization changes. The data bit output is simply the current through sense power source 74. That is, if the hard sphere magnetizations are parallel to their juxtaposed temporary soft sphere magnetizations, then the net bulk resistance between conductors 72 and 73 is relatively low. Whereas, if the hard sphere magnetizations are anti-parallel to the their juxtaposed temporary soft sphere magnetizations, then the net bulk resistance between conductors 72 and 73 is relatively high. (Each different address A will result in a substantially different magnetic pattern Z of extremely high dimension).

After the initial bulk memory erase, if a memory location was not filled with a '1', then the readout bulk resistance will be distinguishable from readout bulk resistance from a location that was subsequently filled with a '1' (was written to).

Figure 12:
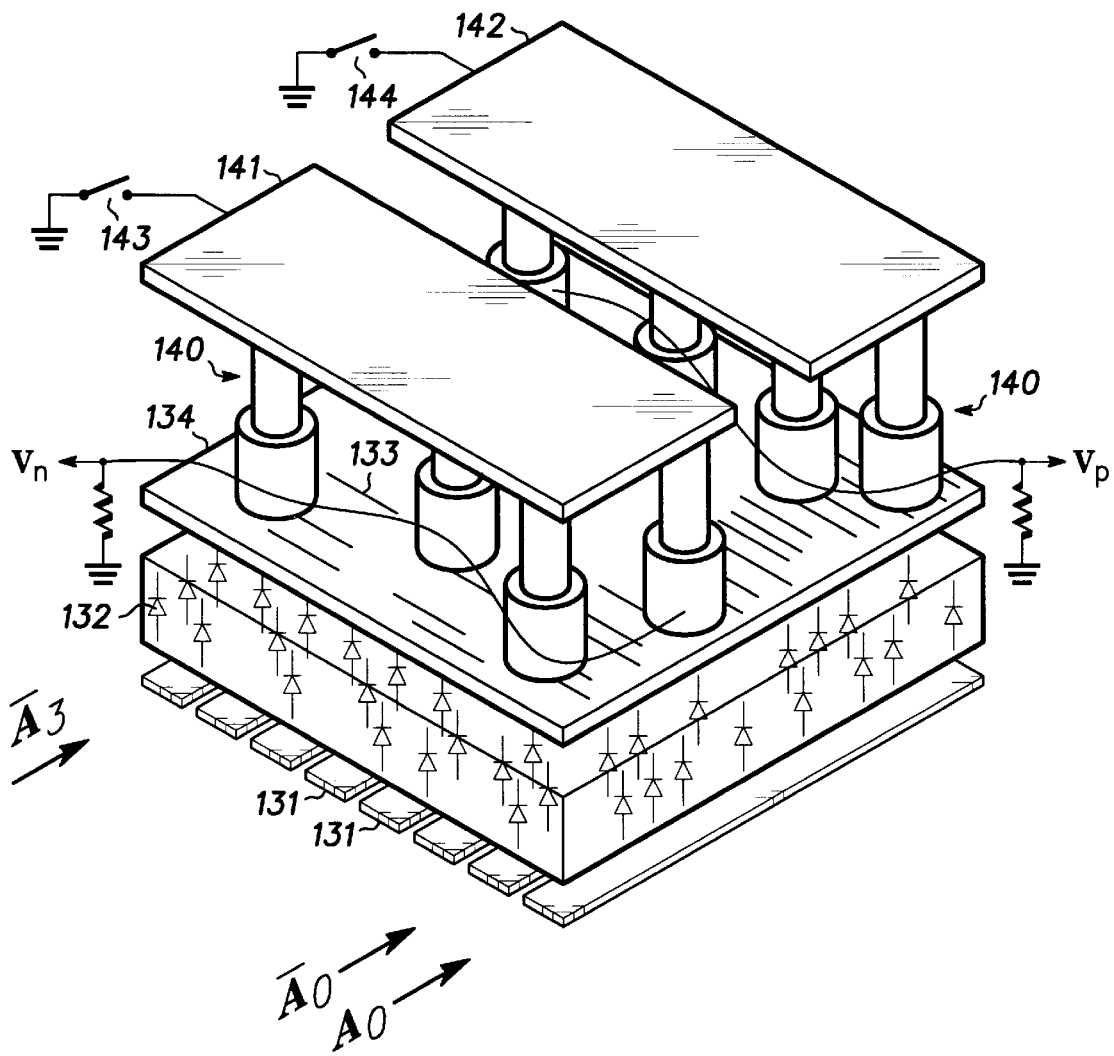
FIG. 12 is a simplified isometric, partial schematic view of another embodiment of quantum random address memory apparatus in accordance with the present invention.

Turning to FIG. 12, a simplified isometric, partial schematic, view is illustrated of another embodiment of quantum random address memory apparatus 130 in accordance with the present invention. Apparatus 130 includes eight address ports, designated $A_0$ through $A_3$, and the invert of each. In this embodiment the address ports are represented by eight parallel spaced apart conductive strips 131, one strip for each of the address ports. A plurality of mixer elements, which in this embodiment are randomly placed nano-diodes 132, each having one terminal (in this embodiment the anode) coupled to the address ports 131.

A plurality (generally thousands) of randomly positioned, but generally parallel oriented electrical conductors 133 (formed in a thin dielectric layer for convenience) are positioned over nano-diodes 132 so as to extend transverse to the parallel spaced apart strips forming address ports 131 with individual conductors pseudo-randomly coupled (to the cathodes) to different nano-diodes or groups of nano-diodes 132. Electrical conductors 133 can be formed and positioned in a variety of different techniques including, for example, conductive polymers or thin metal strands that are suspended in a solution and oriented by a magnetic or electric force during drying of the solution to form a solid layer 134.

A plurality of magnetic nano-memory elements, which in this embodiment include pseudo-randomly placed layered magnetic tunnel nano-junctions 140, are positioned on layer 134. A pair of spaced apart electrical conductors 141 and 142 are positioned over magnetic tunneling nano-junctions 140 so as to extend transverse to the parallel spaced apart strips 131, with each electrical conductor 141 and 142 coupled to a different approximately one half of the plurality of nano-junctions 140. Conductor 141 has a switch 143 attached thereto and to ground so that closing switch 143 grounds conductor 141 and writes a '0' into the n portion of quantum random address memory apparatus 130. Similarly, Conductor 142 has a switch 144 attached thereto and to ground so that closing switch 144 grounds conductor 142 and writes a '1' into the p portion of quantum random address memory apparatus 130. The plurality of nano-junctions 140 positioned between layer 134 and conductor 141 are interconnected, by means which will be described presently, and are connected to a data output terminal $V_n$. Similarly, the plurality of nano-junctions 140 positioned between layer 134 and conductor 142 are interconnected and are connected to a data output terminal $V_p$. It should be noted that none of the structure illustrated in FIG. 12 requires lithography, except possibly strips 131 and electrical conductors 141 and 142, which do not require fine lithography.

Figure 13:
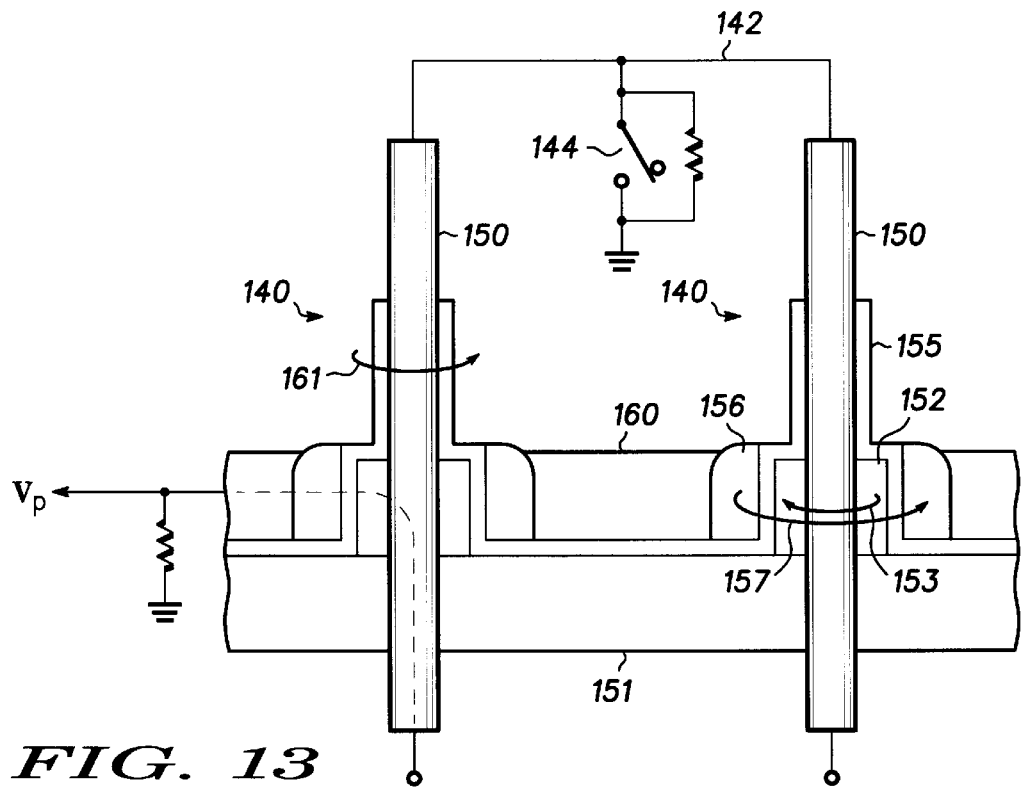
FIG. 13 is a greatly enlarged sectional view of two magnetic memory cells from the apparatus of FIG. 12.

Referring now to FIG. 13, a greatly enlarged sectional view is illustrated of two layered magnetic memory cells 140 from apparatus 130 of FIG. 12. In the construction of cells 140, very fine conductors 150 are pseudo-randomly positioned in an insulating layer 151 so as to extend generally perpendicular to layer 151. A very thin first layer 152 of temporarily magnetized soft magnetic material (i.e. a free magnetic vector 153 encircling conductor 150) is deposited on conductor 150. A very thin insulating tunneling barrier layer 155 is deposited over layer 152, layer 151, and portions of conductors 150 to ensure complete insulation between the magnetic layers. A very thin second layer 156 of permanently magnetized material (i.e. a fixed magnetic vector 157 encircling layer 152) is deposited on layer 155 overlying layer 152 so as to sandwich a portion of barrier layer 155 between magnetic layers 152 and 156 and surrounding each conductor 150. A layer 160 of conducting material is deposited over layer 155 on insulating layer 151 between magnetic layer 156 so as to interconnect all nano-memory cells 140 in the n portion and all nano-memory cells 140 in the p portion of quantum random address memory apparatus 130. The patterning of the nano-memory elements does not require fine lithography since placement is not crucial and any convenient technique can be used to produce the pseudo-random positioning.

Very fine conductors 150 are connected to conductors 141 or 142 (see FIG. 12) which are in turn connected to a switch 143 that writes data into nano-memory cells 140 in the closed position and allows the reading of nano-memory cells 140 in the open position. Current flowing in very fine conductors 150 produce a magnetic field, represented by vector 161, which determines the direction of free vector 153 in magnetic layer 152. As described previously, when magnetic vectors 153 and 157 are in the same direction (parallel) the tunneling resistance of cell 140 is a minimum and when magnetic vectors 153 and 157 are in the opposite direction (anti-parallel) the tunneling resistance of cell 140 is a maximum. Conductive layer 160 is separated into two portions (not shown), which are connected to a data output terminal $V_n$ or $V_p$. Spaced apart electrical conductors 141 and 142 are positioned over nano-memory elements 140 (i.e. arranged so as to thoroughly mix the influences from combinations of address A bits) so as to extend transverse to the parallel spaced apart strips 131, with each electrical conductor 141 and 142 coupled to a different approximately one half of the plurality of nano-memory elements 140 (i.e. arranged so as to provide two intrinsically balanced halves of a differential output).

Figure 14:
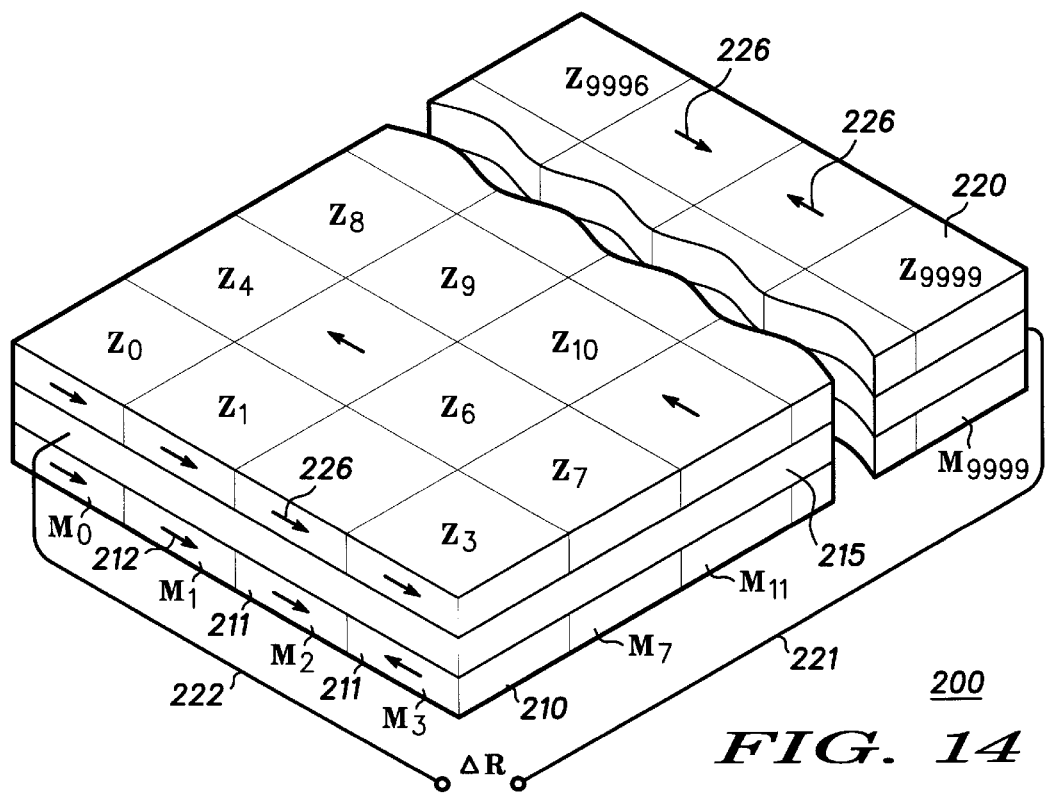
FIG. 14 is an isometric view of a magnetic readout in accordance with the present invention.

Turning now to FIG. 14, an isometric view is illustrated of a magnetic readout 200 in accordance with the present invention. In this embodiment, magnetic readout 200 replaces, for example, electrical conductors 141 and 142 in quantum random address memory apparatus 130 of FIG. 12. Magnetic readout 200 includes a first thin layer 210 of permanently magnetized material, a very thin layer 215 of electrically conductive material, and a second thin layer 220 of temporarily or soft magnetized material. Layer 220 is designed to be positioned in communication with the plurality of nano-memory elements 140. Layer 210 is composed of a plurality of individual cells 211, each of which has a magnetic vector $M_j$ (where j represents a number from 0 to 9999) confined to the plane of layer 210 and directed either to the left or to the right in FIG. 14. Because layer 210 is permanently magnetized (or otherwise not easily switchable) magnetic vectors $M_j$ remain in the position illustrated. Layer 215 has a pair of readout leads 221 and 222 attached at opposite edges thereof for supplying readout signals delta R, which is a measure of Z dot M. Second thin layer 220 is composed of a plurality of individual cells 225, each of which has a magnetic vector $Z_j$ (where j represents a number from 0 to 9999, in this embodiment) confined to the plane of layer 220 and directed either to the left or to the right in FIG. 14. Because layer 220 is formed of temporarily magnetized soft magnetic material, magnetic vectors $Z_j$ each assumes a position (directed to the left or to the right) in accordance with current flowing in the nano-memory elements 140 positioned adjacent thereto.

Magnetic readout 200 is a giant magnetoresistive device in which current flowing in conductive layer 215 between a pair of cells 211 and 220 (e.g.$M_0$ and $Z_0$, respectively) is a maximum when the associated magnetic vectors 212 and 226 are pointed in the same direction (parallel) and a minimum when the associated magnetic vectors 212 and 226 are pointed in the opposite direction (anti-parallel). Thus, if all the magnetic vectors 226 for $Z_j$ are in the same direction as the corresponding magnetic vectors 212 for $M_j$, then the resistance between readout leads 221 and 222 is at a minimum. Conversely, if all the magnetic vectors 226 for $Z_j$ are in the opposite direction as the corresponding magnetic vectors 226 for $M_j$, then the resistance between readout leads 221 and 222 is at a maximum. While magnetic readout 200 is a giant magnetoresistive device in this embodiment, a magnetic readout device using magnetic tunnel junctions (described in detail above) could be utilized if desired.

Thus, a new and improved magnetic memory which does not require the individual addressing via critically placed conductors of each bit in the memory for read and/or write operations is disclosed. The new and improved memory is relatively simple and inexpensive to manufacture and has virtually no upper limits on the size, or number of bytes it can store. Also, the new and improved memory is highly manufacturable and does not require lithography to produce the memory elements but is still much smaller than prior art memories. In addition a magnetic readout can be used with or without the new magnetic memory.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A quantum random address memory comprising:
   a plurality of address ports providing a low dimensional plurality of addresses;
   data output structure;
   a plurality of magnetic nano-memory elements;
   a plurality of pseudo-randomly positioned, non-linear mixer elements coupling one of the plurality of address ports and the data output structure to a high dimensional plurality of the plurality of magnetic nano-memory elements; and
   the other of the plurality of address ports and the data output structure being coupled to the plurality of magnetic nano-memory elements, wherein the high dimensional plurality of magnetic nano-memory elements is greater than the low dimensional plurality of addresses.

2. Quantum random address memory apparatus as claimed in claim 1 wherein the high dimensional plurality of magnetic nano-memory elements is greater than the low dimensional plurality of addresses by at least a factor of 40.

3. Quantum random address memory apparatus as claimed in claim 1 wherein the plurality of magnetic nano-memory elements are pseudo-randomly placed on a support structure.

4. Quantum random address memory apparatus as claimed in claim 3 wherein the magnetic nano-memory elements each include one of a plurality of spherical magnetic tunnel junctions and a plurality of layered magnetic tunnel junctions.

5. Quantum random address memory apparatus as claimed in claim 4 wherein the plurality of spherical magnetic tunnel junctions each include a sphere of temporarily magnetizable magnetic material and a sphere of permanently magnetized ferro-magnetic material, one of the sphere of temporarily magnetizable magnetic material and the sphere of permanently magnetized ferro-magnetic material having thereon a layer of tunnel barrier material, and the sphere of temporarily magnetizable magnetic material and the sphere of permanently magnetized ferro-magnetic material being held in juxtaposition with the layer of tunnel barrier material positioned therebetween.

6. Quantum random address memory apparatus as claimed in claim 4 wherein the plurality of layered magnetic tunnel junctions each include a first layer of magnetic material having a fixed magnetic vector, a layer of insulating material positioned on the first layer of magnetic material, and a second layer of magnetic material positioned on the layer of insulating material, the second layer of magnetic material having a free magnetic vector, the second layer of magnetic material being positioned adjacent the plurality of pseudo-randomly positioned, non-linear mixer elements.

7. Quantum random address memory apparatus as claimed in claim 1 wherein the data output structure includes a first layer of magnetic material with a plurality of magnetized areas each having a fixed magnetic vector, a layer of insulating material positioned on the first layer of magnetic material, and a second layer of magnetic material positioned on the layer of insulating material, the second layer of magnetic material having a plurality of magnetized areas each having a free magnetic vector with the plurality of magnetized areas of the second magnetic layer overlying the plurality of magnetized areas of the first magnetic layer, the second layer of magnetic material being positioned adjacent one of the plurality of pseudo-randomly positioned, non-linear mixer elements and the plurality of magnetic nano-memory elements.

8. Quantum random address memory apparatus as claimed in claim 1 wherein the data output structure includes a first layer of magneto-resistive material with a plurality of magnetized areas each having a fixed magnetic vector, a layer of electrically conducting material positioned on the first layer of magneto-resistive material, and a second layer of magneto-resistive material positioned on the layer of conducting material, the second layer of magnetoresistive material having a plurality of magnetized areas each having a free magnetic vector with the plurality of magnetized areas of the second magneto-resistive layer overlying the plurality of magnetized areas of the first magneto-resistive layer, the second layer of magnetoresistive material being positioned adjacent one of the plurality of pseudo-randomly positioned, non-linear mixer elements and the plurality of magnetic nano-memory elements.

9. A quantum random address memory comprising:
   a plurality of address ports providing a low dimensional plurality of addresses;
   data output structure including a magnetic readout;
   a plurality of nano-memory elements;
   a plurality of randomly positioned, non-linear mixer elements coupling one of the plurality of address ports and the data output structure to a high dimensional plurality of the plurality of nano-memory elements; and the other of the plurality of address ports and the data output structure being coupled to the plurality of nano-memory elements, wherein the high dimensional plurality of nano-memory elements is greater than the low dimensional plurality of addresses.

10. Quantum random address memory apparatus as claimed in claim 9 wherein the magnetic readout of the data output structure includes layers of one of magnetic tunnel junctions and magneto-resistive material.

11. Quantum random address memory apparatus as claimed in claim 10 wherein the magnetic readout includes a first layer of magnetic material with a plurality of magnetized areas each having a fixed magnetic vector, a layer of insulating material positioned on the first layer of magnetic material, and a second layer of magnetic material positioned on the layer of insulating material, the second layer of magnetic material having a plurality of magnetized areas each having a free magnetic vector with the plurality of magnetized areas of the second magnetic layer overlying the plurality of magnetized areas of the first magnetic layer, the second layer of magnetic material being positioned adjacent one of the plurality of pseudo-randomly positioned, non-linear mixer elements and the plurality of nano-memory elements.

12. Quantum random address memory apparatus as claimed in claim 10 wherein the data output structure includes a first layer of magneto-resistive material with a plurality of magnetized areas each having a fixed magnetic vector, a layer of electrically conducting material positioned on the first layer of magneto-resistive material, and a second layer of magneto-resistive material positioned on the layer of conducting material, the second layer of magnetoresistive material having a plurality of magnetized areas each having a free magnetic vector with the plurality of magnetized areas of the second magneto-resistive layer overlying the plurality of magnetized areas of the first magneto-resistive layer, the second layer of magnetoresistive material being positioned adjacent one of the plurality of pseudo-randomly positioned, non-linear mixer elements and the plurality of nano-memory elements.

13. Quantum random address memory apparatus comprising:

a plurality of address ports providing a low dimensional plurality of addresses;

a plurality of nano-memory magnetic tunnel junction elements pseudo-randomly placed on a support structure;

pseudo-randomly positioned, non-linear mixer elements coupling the address ports to a high dimensional plurality of the plurality of nano-memory magnetic tunnel junction elements;

similarity or comparison structure coupled to the plurality of nano-memory magnetic tunnel junction elements for detecting a read-out pattern of the plurality of nano-memory magnetic tunnel junction elements for each address applied to the plurality of address ports; and data output ports coupled to the similarity or comparison structure for providing an output signal for each address applied to the plurality of address ports, wherein the high dimensional plurality of nano-memory magnetic tunnel junction elements is greater than the low dimensional plurality of addresses by a number resulting in substantially error free memory recalls.

14. Quantum random address memory apparatus as claimed in claim 13 wherein the high dimensional plurality of nano-memory magnetic tunnel junction elements is greater than the low dimensional plurality of addresses by at least a factor of 40.

15. Quantum random address memory apparatus as claimed in claim 13 wherein the nano-memory magnetic tunnel junction elements each include one of spherical magnetic tunnel junctions and layered magnetic tunnel junctions.

16. Quantum random address memory apparatus as claimed in claim 13 wherein the similarity or comparison structure includes layers of magneto-resistive material.

17. Quantum random address memory apparatus comprising a volume containing pseudo-randomly meandering insulation coated electrical conductors and pseudo-randomly placed magnetic elements.

* * * * *